United States Patent [19]
Nakazawa et al.

[11] Patent Number: 5,695,627
[45] Date of Patent: Dec. 9, 1997

[54] PROCESS FOR PRODUCING COPPER-INDIUM-SULFUR-SELENIUM THIN FILM AND PROCESS FOR PRODUCING COPPER-INDIUM-SULFUR-SELENIUM CHALCOPYRITE CRYSTAL

[75] Inventors: Tatsuo Nakazawa, Nagano; Tomio Hirano; Takeshi Kamiya, both of Shizuoka, all of Japan

[73] Assignee: Yazaki Corporation, Tokyo, Japan

[21] Appl. No.: 686,517

[22] Filed: Jul. 26, 1996

[30] Foreign Application Priority Data

Jul. 26, 1995 [JP] Japan .................. HEI 7-190581

[51] Int. Cl.$^6$ .................................................. C25D 5/50
[52] U.S. Cl. .................. 205/227; 205/239; 205/242; 136/264; 136/265; 437/5
[58] Field of Search .................. 205/239, 242, 205/227, 228; 136/264, 265; 437/5

[56] References Cited

U.S. PATENT DOCUMENTS 5,275,714  1/1994  Bonnet et al. .

OTHER PUBLICATIONS

Hodes et al, "Electrodeposition Of $CuInSe_2$ and $CuInS_2$ Films", Solar Cells, vol. 16 (1986), pp. 245–254.
Bhattacharya et al, "Electrodeposition of CuInX (X=$Se_1Te$) Films", Solar Cells, vol. 16 (1986), pp. 237–243.
Guillemoles et al, "Think Film Solar Cells Based on One Step Electrodeposited Copper Indium Diselenide", *12ht European Photovoltaic Solar Energy Conference*, (1994) pp. 1550–1553.
Ganchev et al, "Investigation of the Electrodeposition Process in the Cu–In–Se System", *Solar Energy Materials and Solar Cells*, 31 (1993) pp. 163–170.

Primary Examiner—Kathryn L. Gorgos
Assistant Examiner—Kishor Mayekar
Attorney, Agent, or Firm—Sughrue, Mion, Zinn, Macpeak & Seas, PLLC

[57] ABSTRACT

A process for producing a copper-indium-sulfur-selenium thin film which comprises subjecting an electro-conductive substrate to an electrodeposition treatment in the presence of copper sulfate, indium sulfate, selenium dioxide, and thiourea. A process for producing a chalcopyrite crystal which comprises subjecting an electro-conductive substrate to an electrodeposition treatment in the presence of copper sulfate, indium sulfate, selenium dioxide, and thiourea, and then conducting a heat treatment.

8 Claims, 7 Drawing Sheets

PROCESS FOR PRODUCING COPPER-INDIUM-SULFUR-SELENIUM THIN FILM AND PROCESS FOR PRODUCING COPPER-INDIUM-SULFUR-SELENIUM CHALCOPYRITE CRYSTAL

FIELD OF THE INVENTION

The present invention relates to a process for producing a copper-indium-sulfur-selenium thin film which can be used in, e.g., thin-film solar cells.

BACKGROUND OF THE INVENTION

A solar cell is a device which converts light energy into electrical energy. Although single-crystal silicon has long been employed, use of single-crystal silicon has drawbacks that solar cells having a large area are difficult to fabricate and single-crystal cells are costly. Accordingly, amorphous silicon and compound semiconductors have come to be used in recent years. Of these compound semiconductors, ternary alloys comprising Groups 11, 13, and 16 elements are recently receiving attention.

As applications of such ternary alloys, $Cu(In,Ga)Se_2$ and $CuIn(S,Se)_2$ which are solid solutions of gallium or sulfur have come to be investigated recently.

These quaternary (quinary) compounds can be regulated so as to have a forbidden band width most suitable for the sunlight spectrum. Therefore, a higher conversion efficiency can be realized with these compounds.

However, the prior art techniques for producing these quaternary or quinary compounds are limited to vacuum film-forming techniques (e.g., sputtering, CVD), which have drawbacks of low production efficiency, high production cost, and the necessity of special equipment.

Consequently, there has been a desire for a production technique which does not use a vacuum and is suitable for practical use.

SUMMARY OF THE INVENTION

An object of the present invention, which eliminates the above-described problems of the prior art techniques, is to provide a process for producing a copper-indium-sulfur-selenium thin film while regulating the content of each component, without using any of the vacuum film-forming techniques having many drawbacks.

This and other objects of the present invention have been attained by a process for producing a copper-indium-sulfur-selenium thin film which comprises subjecting an electro-conductive substrate to an electrodeposition treatment in the presence of copper sulfate, indium sulfate, selenium dioxide, and thiourea.

Furthermore, this and other objects of the present invention have been attained by a process for producing a copper-indium-sulfur-selenium thin film which comprises adding thiourea to an aqueous solution acidified with sulfuric acid in which copper sulfate, indium sulfate, and selenium dioxide are dissolved, removing the resulting precipitate from the aqueous solution to obtain an electrodeposition solution, and subjecting an electro-conductive substrate to an electrodeposition treatment using the obtained electrodeposition solution.

Moreover, this and other objects of the present invention have been attained by a process for producing a chalcopyrite crystal which comprises subjecting an electro-conductive substrate to an electrodeposition treatment in the presence of copper sulfate, indium sulfate, selenium dioxide, and thiourea, and then conducting a heat treatment.

Still furthermore, this and other objects of the present invention have been attained by a process for producing a chalcopyrite crystal which comprises adding thiourea to an aqueous solution acidified with sulfuric acid in which copper sulfate, indium sulfate, and selenium dioxide are dissolved, removing the resulting precipitate from the aqueous solution to obtain an electrodeposition solution, subjecting an electro-conductive substrate to an electrodeposition treatment using the obtained electrodeposition solution, and then conducting a heat treatment.

DETAILED DESCRIPTION OF THE INVENTION

Figure 1:
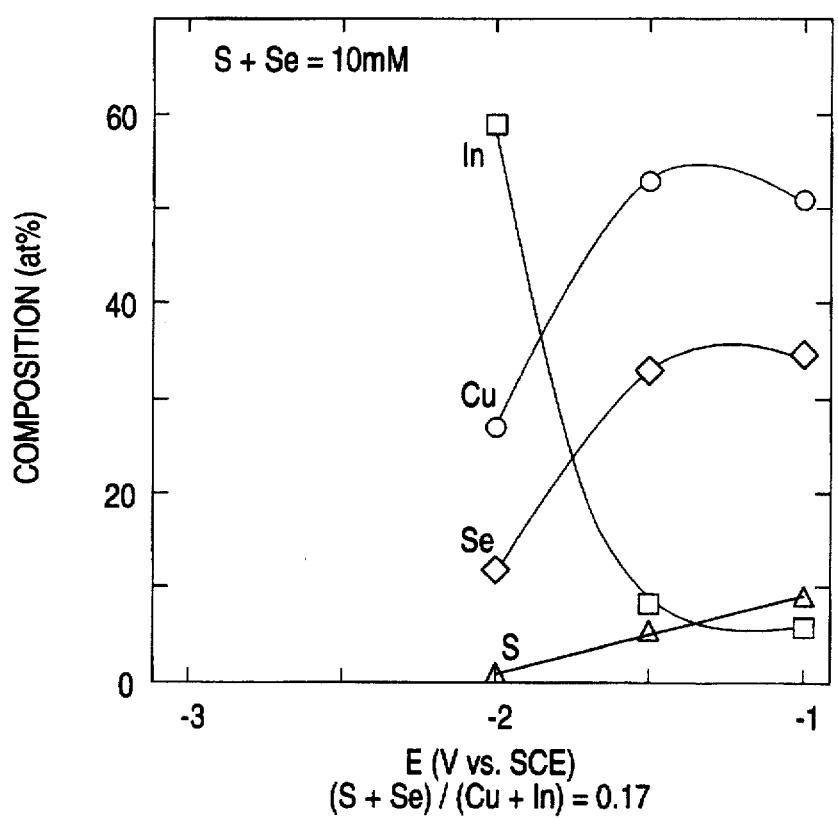
FIG. 1 shows the contents of each component in deposited films formed using a solution in which the ratio of the sum of sulfur and selenium to the sum of copper and indium is 0.17.

In the process for producing a copper-indium-sulfur-selenium thin film or a chalcopyrite crystal of the present invention, the composition ratio of the elements constituting the thin film or chalcopyrite crystal (e.g., copper, indium, sulfur, selenium) is preferably controlled by regulating the deposition potential in the electrodeposition treatment and the concentration of the solution for the electrodeposition treatment.

In the present invention, the atom ratio of copper, indium, selenium, and sulfur is from 1:5–20:0.5–8:0.4–40. The ratio of these elements are an atom ratio hereinafter. The copper, indium, and selenium contained in the electrodeposition solution are supplied by adding copper sulfate, indium sulfate, and selenium dioxide, respectively. Furthermore, the sulfur (participating in electrodeposition) contained in the solutions is regarded as derived from thiourea, and the sulfur derived from sulfate ions is not taken in account hereinafter.

In the present invention, the deposition potential (vsSCE) is −0.5 to −3.0 V. SCE indicates a saturated calomel electrode, and vsSCE indicates a potential based on the saturated calomel electrode. The current density is from 8 to 40 mA/cm$^2$; however, the current density is not a fixed value because the conditions of the present invention are controlled by the deposition potential. The deposition time is from 1 to 20 minutes.

In the present invention, copper sulfate ($CuSO_4$), indium sulfate ($In_2(SO_4)_3$), and selenium dioxide ($SeO_2$) are dissolved in water. The pH of this solution is adjusted to 1.0 to 4.0, preferably 1.8 to 2.2, with sulfuric acid. And then, thiourea ($H_2NSNH_2$) is added to obtain an electrodeposition solution. If necessary, the obtained electrodeposition solution is filtered.

The thin layer formed in the present invention preferably has a thickness of 1 to 3 μm.

The heat treatment for forming the chalcopyrite crystal of the present invention is carried out at a temperature of 400° to 550° C. after heating at a raising temperature rate of 20° to 70° C./min.

Examples of the electro-conductive substrate for use in the present invention include Mo, Ti, Cr and Pt.

The present invention is now illustrated in greater detail by way of the following examples, but it should be understood that the present invention is not to be construed as being limited thereto.

EXAMPLES

In Table 1 are shown the compositions of the electrodeposition solutions and deposition conditions used in the present invention.

TABLE 1

| Element | Proportion in electro-deposition solution |
|---|---|
| Copper | 1 |
| Indium | 5–10 |
| Selenium | 0.5–2 |
| Sulfur | 0.5–20 |
| Deposition potential (vsSCE) | −1.0 to −3.0 V |
| Current density | 8–40 mA/cm$^2$ |
| Deposition time | 10 min |

Preparation of Electrodeposition Solution

Copper sulfate ($CuSO_4$), indium sulfate ($In_2(SO_4)_3$), and selenium dioxide ($SeO_2$) were dissolved in water. The pH of this solution was adjusted with sulfuric acid (this pH-regulated solution was transparent and free from a precipitate).

Thiourea ($H_2NSNH_2$) was then added to obtain an electrodeposition solution. This addition of thiourea resulted in a red to yellow precipitate, from which phenomenon the solution was presumed to have undergone a compositional change.

To cope with the compositional change of the electrodeposition solution, the solution was filtered at a certain period (10 hours in the following Examples) after the addition of thiourea, and used for deposition immediately thereafter.

Other Conditions, Analysis Method and the Like

Current density for electrodeposition varies depending on deposition potential. When low deposition potentials (high minus potentials) was used, black deposited layers resulted which have a surface roughened with adherent fine particles. These black particles became larger as the deposition time was prolonged and the enlarged particles tended to readily fall off the surface during electrodeposition, subsequent cleaning, or handling.

The electrodeposited films obtained with the electrodeposition solution described above were satisfactory, although slight defects were observed in a peripheral part.

The films obtained by electrodeposition were analyzed by EPMA (X-ray microanalysis) to determine the content of each element. The films were further evaluated for crystal structure by X-ray diffraction analysis.

Crystallinity was evaluated by the above-described X-ray analysis after the films were heat-treated at 350° to 650° C. and 7×10$^{-6}$ Torr for 30 minutes.

For the electrodeposition, a molybdenum plate was used as a cathode and a carbon rod is used as an anode.

Example 1

Influence of chalcogen concentration in electrodeposition solution:

The relationship between deposition potential and deposited-film composition was examined using three electrodeposition solutions in which the ratio of the amount of thiourea-derived sulfur to the amount of selenium was 1:1 and the ratio of the amount of copper to the amount of indium was 1:5, and which were different in the concentration of the sum of thiourea-derived sulfur and selenium (chalcogen concentration).

In the solutions used, the ratios of the concentration of the sum of thiourea-derived sulfur and selenium (chalcogen concentration) to the concentration of the sum of copper and indium were 0.17, 0.33, and 0.67, respectively. The results obtained are shown in FIGS. 1, 2, and 3.

Figure 2:
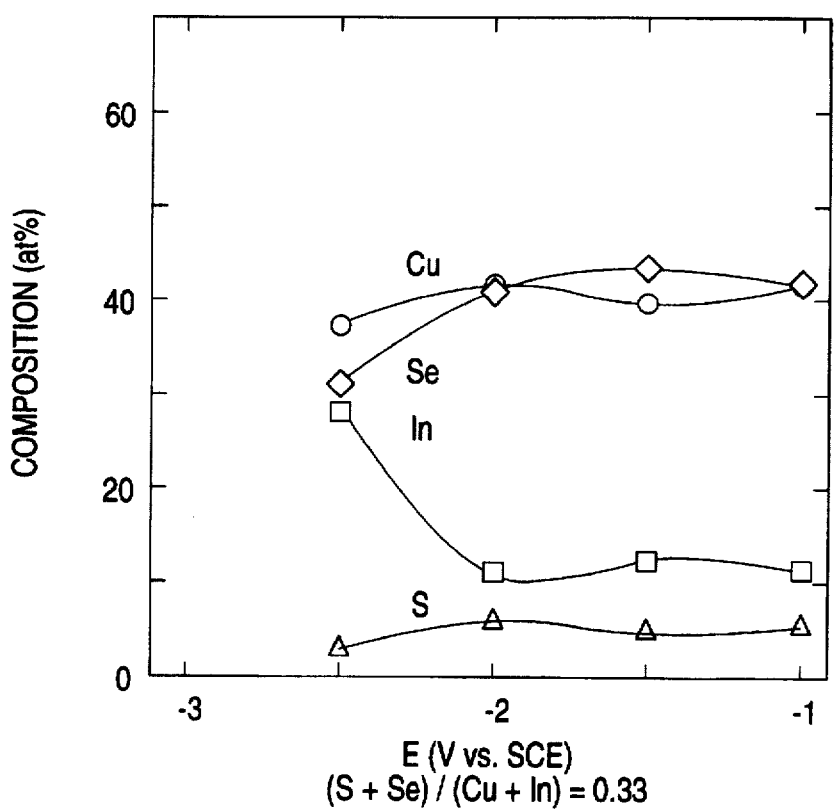
FIG. 2 shows the contents of each component in deposited films formed using a solution in which the ratio of the sum of sulfur and selenium to the sum of copper and indium is 0.33.
Figure 3:
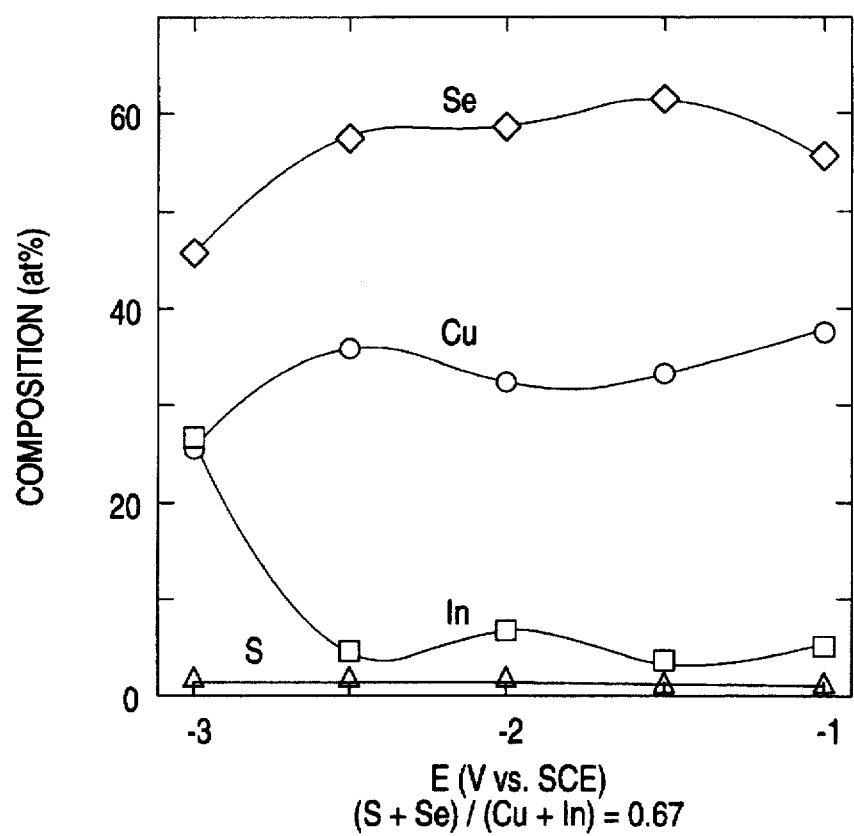
FIG. 3 shows the contents of each component in deposited films formed using a solution in which the ratio of the sum of sulfur and selenium to the sum of copper and indium is 0.67.

In FIGS. 1 to 3, the unit at % for the ordinate indicates the percentage of atoms of each element.

FIGS. 1 to 3 show the following.

Copper is the most easily electrodeposited among those four elements. Electrodeposition of copper is less influenced by the chalcogen concentrations in the electrodeposition solutions or by deposition potentials. Copper is incorporated into films in an amount of from 30 to 50 at %.

Electrodeposition of indium is considerably influenced by deposition potential, and the amount of indium electrodeposited at potentials lower than a specific value differs markedly from that of indium electrodeposited at potentials higher than that specific value. This specific potential value shifts from around −1.7 V to around −2.5 V as the chalcogen concentration increases. Increased indium concentrations in a film result in reduced concentrations of copper and selenium.

Like copper, selenium is relatively easily electrodeposited. Although selenium is incorporated into films in a constant proportion without being influenced by deposition potential, increased chalcogen concentrations in an electrodeposition solution result in increased amounts of electrodeposited selenium.

Sulfur is least apt to be electrodeposited among the four elements. The maximum sulfur content in the films was as low as about 10 at %. Although sulfur deposition amount is less influenced by deposition potential or the chalcogen concentrations in electrodeposition solutions, lower chalcogen concentrations tend to result in larger amounts of sulfur incorporated into the films.

As described above, the contents of three elements, copper, indium, and selenium, in a film can be controlled by regulating deposition potential and the concentrations thereof in an electrodeposition solution.

Example 2

Figure 4:
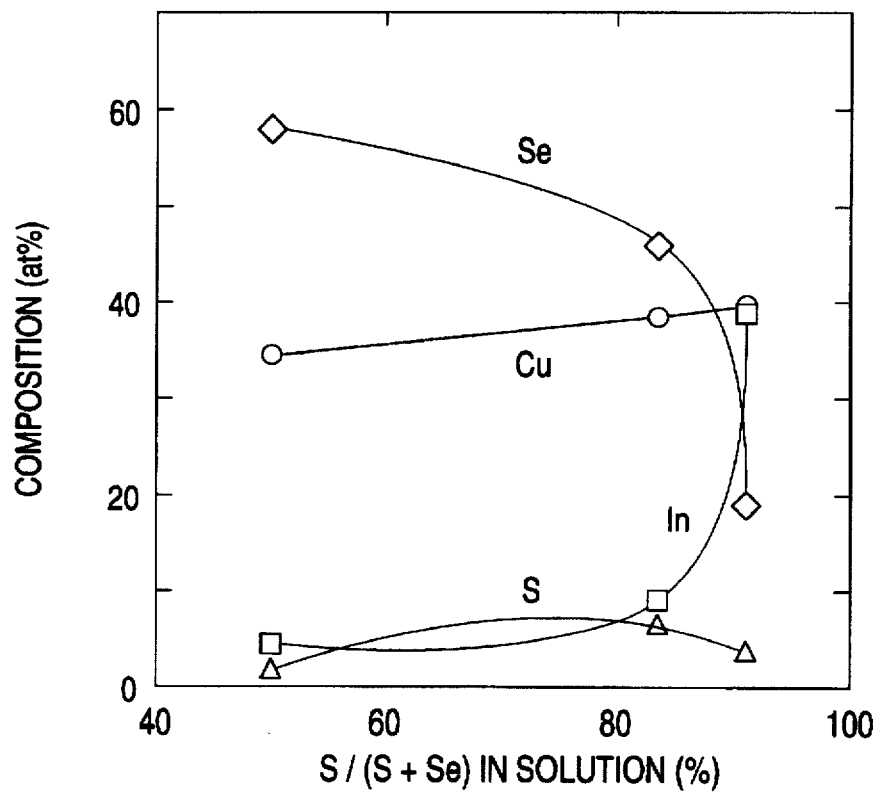
FIG. 4 shows compositional changes of deposited films with changing a sulfur concentration in an electrodeposition solution.

Influence of filtration of electrodeposition solution:

FIG. 4 shows the influence of the proportion of sulfur in chalcogens contained in an electrodeposition solution on the content of each element in a film electrodeposited at a deposition potential of 1.5 V. Also from FIG. 4, it can be seen that sulfur is less apt to be electrodeposited even when the concentration of sulfur in the electrodeposition solution is increased. The reason for this may be that the precipitation due to the addition of thiourea to the electrodeposition solution proceeds even during electrodeposition, or that the adhesion of either the precipitate caused by the addition of thiourea or a precursor for that precipitate to the molybdenum substrate surface influences sulfur electrodeposition.

An electrodeposition solution prepared in the same manner as for an electrodeposition solution used in Example 1 was filtered at 10 hours after preparation thereof and used for examining the influence of the filtration.

That is, a solution containing copper, indium, selenium, and sulfur (derived from thiourea) in a proportion of 1:5:2:20 was prepared, and filtered after 10-hour standing. Using the thus-obtained electrodeposition solution, electrodeposition was conducted at electrodeposition potentials varying from −1 to −2 V (vsSCE). Each electrodeposited film was analyzed for the content of each element. The results obtained are shown in FIG. 5.

Figure 5:
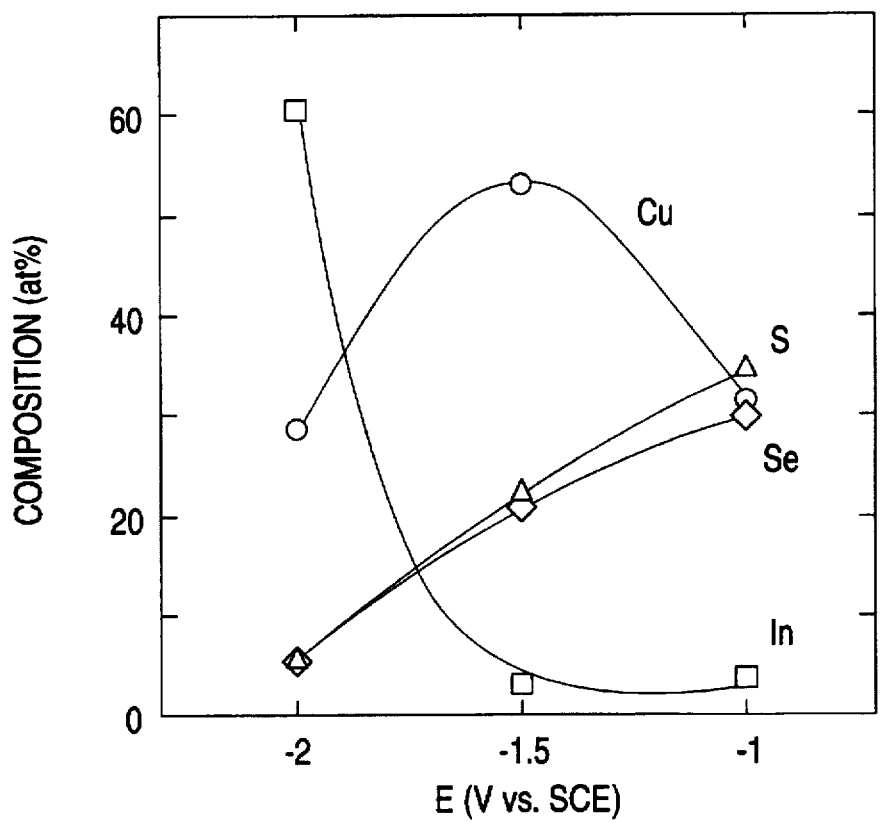
FIG. 5 shows the dependence on deposition potential of the composition of a film electrodeposited from a solution from which a precipitate has been removed.

It can be seen from FIG. 5 that in the case of using the filtered electrodeposition solution, copper is deposited in various amounts depending on electrodeposition potential; the lower the minus potential, the larger the electrodeposited sulfur amount.

On the other hand, copper and indium in the above electrodeposition show the same tendency as in Example 1. That is, indium is electrodeposited only at high minus potentials. Selenium was influenced by deposition potential like sulfur, and the electrodeposited selenium amounts were almost the same as the electrodeposited sulfur amounts.

The electrodeposited films thus obtained (hereinafter referred to as "as-depo films") were subjected to X-ray analysis. As a result, no distinct peak was observed.

Figure 6:
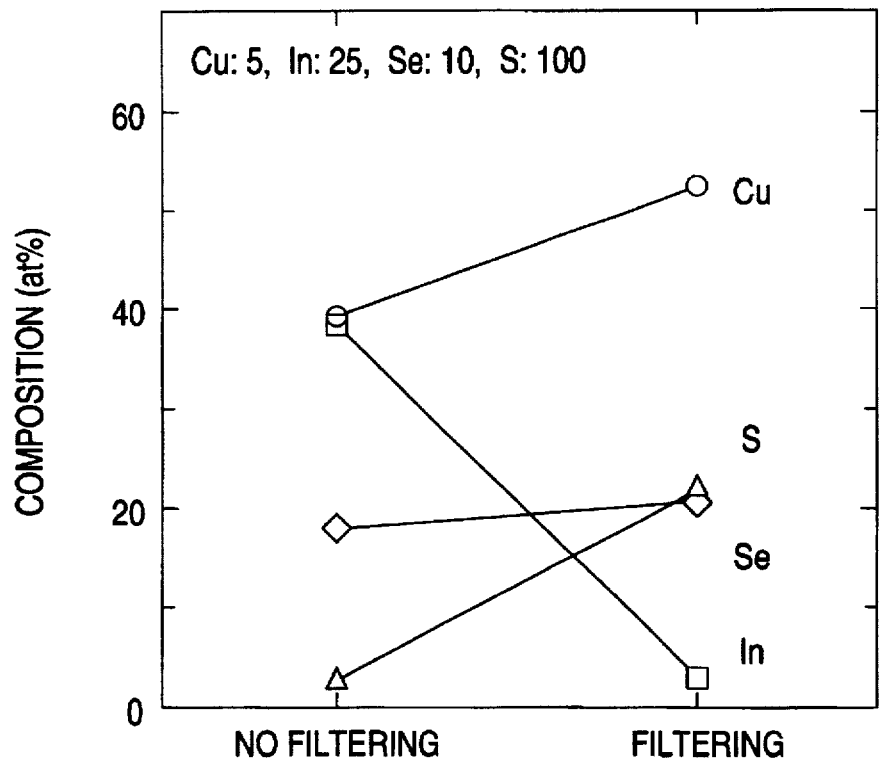
FIG. 6 shows the results of elemental analyses of films electrodeposited from a filtered electrodeposition solution or an unfiltered electrodeposition solution.

In FIG. 6 are shown differences in the contents of the individual elements between electrodeposited films respectively obtained from the unfiltered solution and the filtered solution.

It can be seen from FIG. 6 that use of the filtered solution is effective in forming a deposited film having an increased sulfur content.

Figure 7:
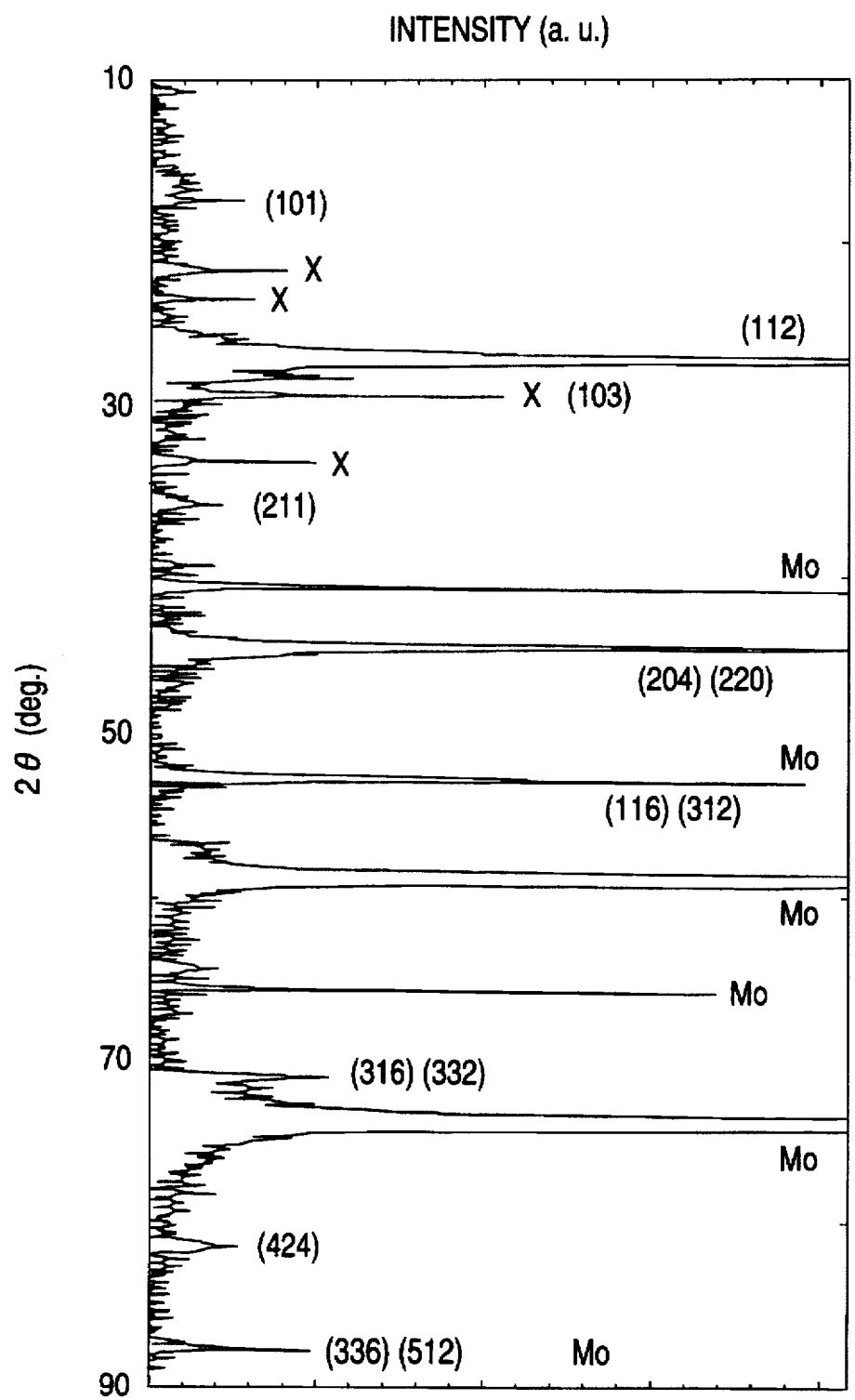
FIG. 7 shows an X-ray diffraction spectrum of a heat-treated film.

The electrodeposited films obtained above were heat-treated to evaluate crystallinity. In FIG. 7 is shown an X-ray diffraction spectrum of a film heat-treated at 350° C. The spectrum contains diffraction peaks characteristic of a chalcopyrite, including a sharp peak assignable to (112) face and peaks assignable to (101), (103), and (211) faces. The results clearly show that crystallinity has been improved.

Figure 8:
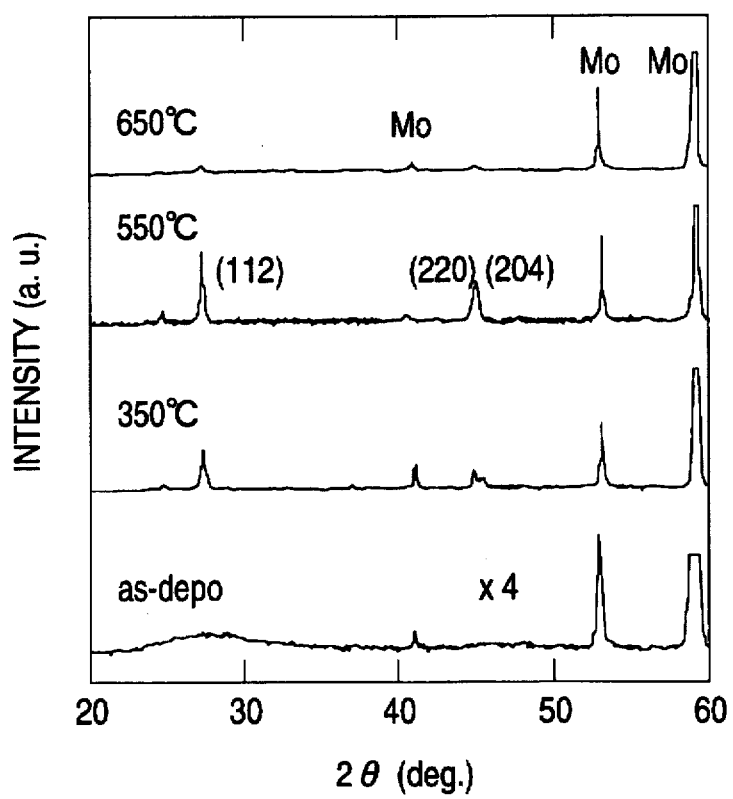
FIG. 8 shows X ray diffraction spectra of films which have been treated at various temperatures.

In FIG. 8 are shown X-ray diffraction spectra of films heat-treated at various temperatures.

It can be seen from FIG. 8 that the peaks characteristic of a chalcopyrite, which are observed in the spectrum of the film heat-treated at 350° C. but not observed in the spectrum of the as-depo film, became larger through treatment at 550° C. In the spectrum of the film treated at 650° C., however, those peaks were smaller. The reason for this may be that the sample treated at 650° C. suffered delamination after the heat treatment and this delamination influenced the crystal structure.

These heat treatments caused little compositional change.

Since the sulfur concentrations in the films were as low as 10 at % or below even in the case of the as-depo film, the shift toward the higher-angle side which indicates the formation of $CuIn(S,Se)_2$ in the heat-treated films was slight. In the X-ray diffraction analysis of a silicon powder standard, the diffraction peak assignable to (112) face shifted by about 0.1 degree toward the higher-angle side, showing that crystals of $CuIn(S,Se)_2$ had been formed.

Figure 9:
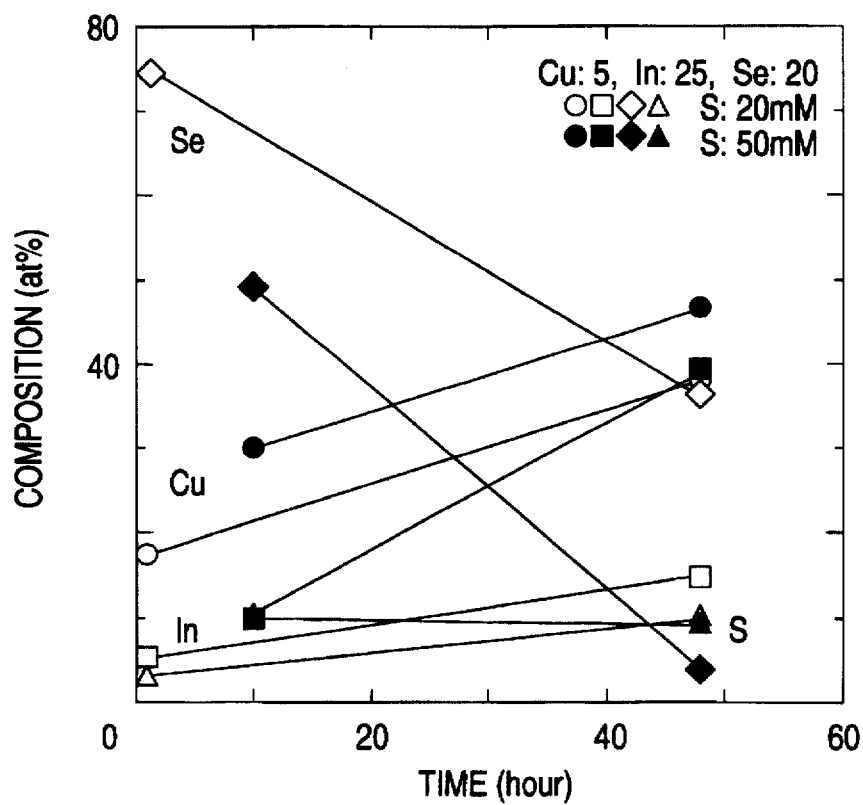
FIG. 9 shows the concentration of each component in an electrodeposition solution just after filtration, and the influence of the lapse of time thereafter.

Electrodeposition solutions prepared by adding thiourea in such amounts as to result in thiourea-derived sulfur amounts of 20 mmol/l and 50 mmol/l, respectively, to a solution containing 5 mmol/l copper, 25 mmol/l indium, and 20 mmol/l selenium developed a precipitate. Immediately after the precipitate was removed by filtration, these electrodeposition solutions were transparent. However, with the lapse of time thereafter, precipitation proceeded and the concentration of each component changed, as shown in FIG. 9.

Example 3 and Comparative Example

Figure 10:
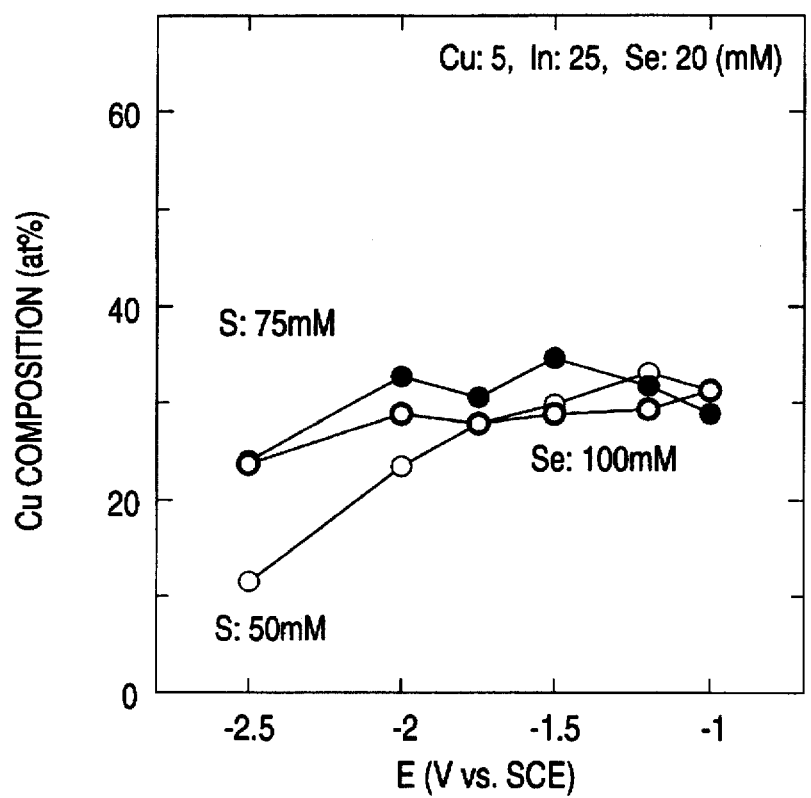
FIG. 10 shows the influence of a sulfur concentration in an electrodeposition solution on copper concentration in an electrodeposited film.
Figure 11:
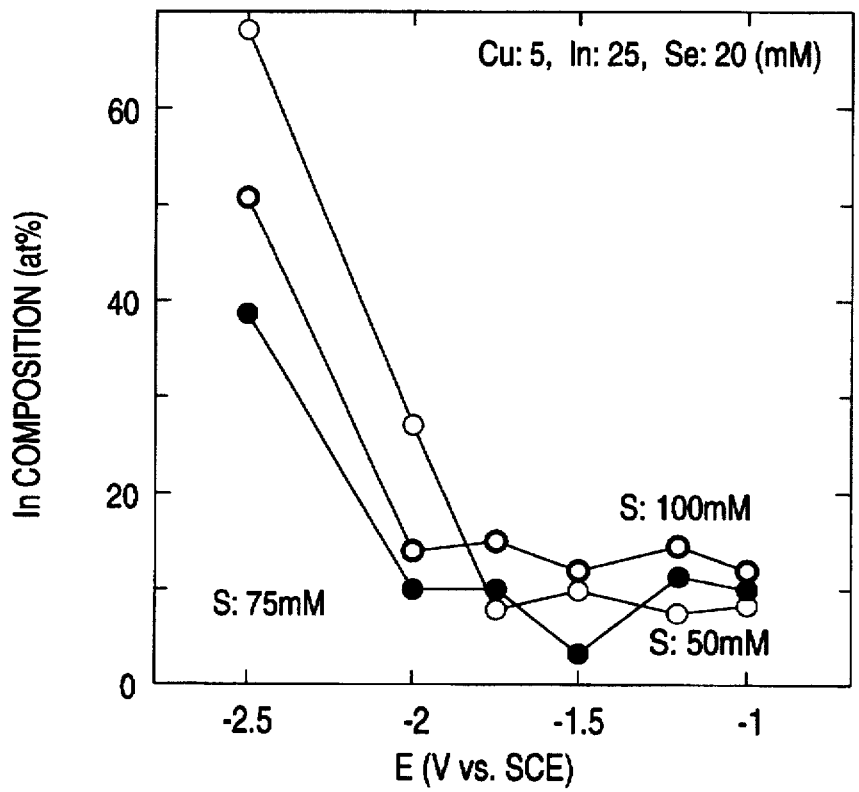
FIG. 11 shows the influence of a sulfur concentration in an electrodeposition solution on indium concentration in an electrodeposited film.

Influence of sulfur concentration in electrodeposition solution:

Electrodeposition solutions prepared by adding thiourea in such amounts as to result in thiourea-derived sulfur amounts of 50 mmol/l, 75 mmol/l, and 100 mmol/l, respectively, to a solution containing 5 mmol/l copper, 25 mmol/l indium, and 20 mmol/l selenium and filtering the mixtures at 10 hours after the addition of thiourea were used (Example 3) to conduct electrodeposition at electrodeposition potentials ranging from −1 to −2.5 V (vsSCE) for each solution. The resulting electrodeposited films were examined for copper content and indium content, and the results obtained are shown in FIGS. 10 and 11, respectively. These films were also examined for the ratio of sulfur content to the content of the sum of sulfur and selenium, and the results obtained are shown in FIG. 12.

It can be seen from FIG. 10 that the electrodeposited films have nearly the same copper concentration, except the film obtained from the solution with a thiourea concentration of 50 mmol/l at an electrodeposition potential of −2.5 V.

From FIG. 11, it can be seen that the films electrodeposited at deposition potentials of −2 V and higher have especially high indium concentrations, while the films obtained at deposition potentials below −2 V have nearly the same indium concentration.

Figure 12:
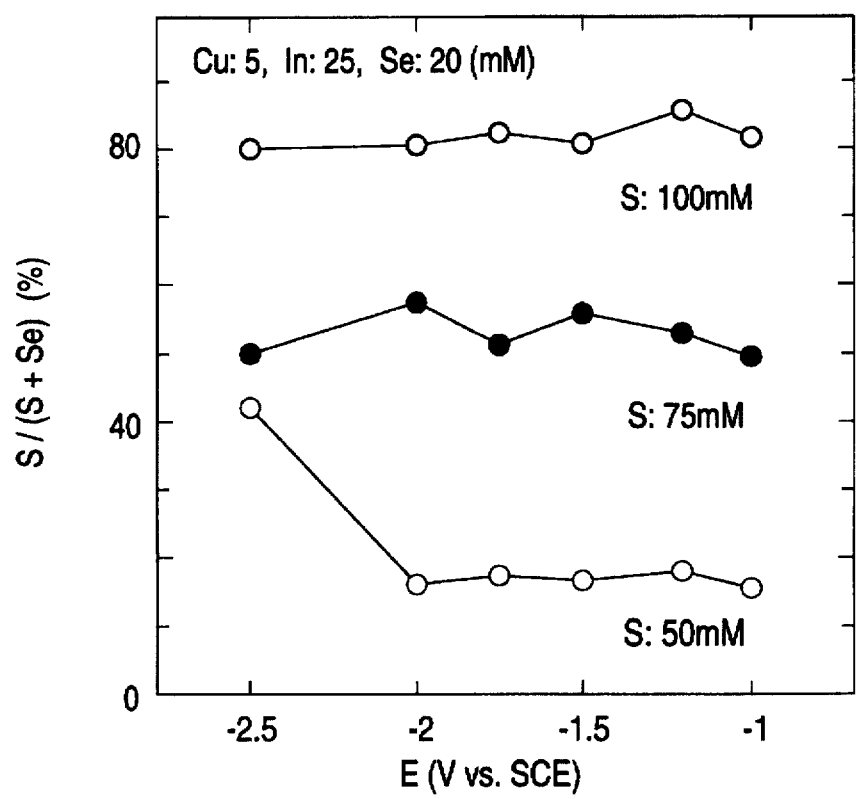
FIG. 12 shows the influence of a sulfur concentration in an electrodeposition solution on the ratio of the amount of sulfur to the sum of sulfur and selenium in an electrodeposited film.

On the other hand, it is apparent from FIG. 12 that electrodeposition solutions having increased ratios of sulfur concentration to selenium concentration give electrodeposited films having increased ratios of sulfur content to selenium content. From the above results, it can be seen that the content of each component in an electrodeposited film can be regulated using the phenomena described above.

According to the present invention, crystalline $CuIn(S, Se)_2$, which is expected to realize a solar cell having an improved efficiency due to the band gap, can be obtained without using a vacuum technique. The chalcopyrite crystals thus formed by the present invention through a heat treatment have improved crystallinity.

Furthermore, the elements can be deposited in various proportions by regulating the concentrations of the individual components in a solution or by regulating deposition potential.

In this case, the amount of sulfur in an electrodeposited film can be controlled by filtering the electrodeposition solution.

Figure 13:
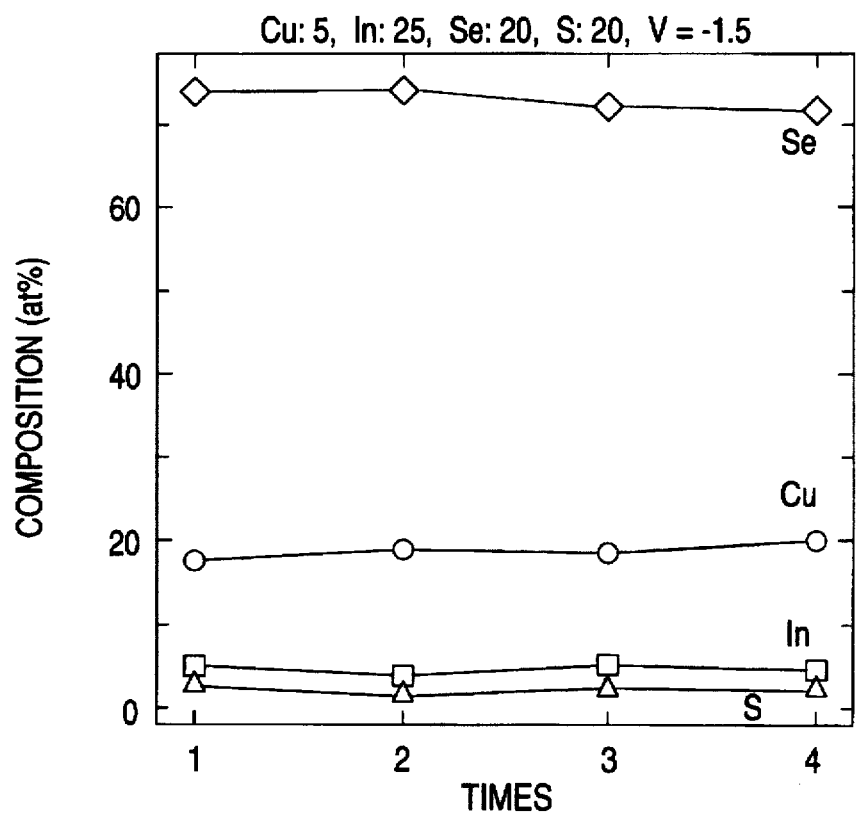
FIG. 13 shows the results of elemental analyses of four deposited films obtained from one electrodeposition solution through four deposition operations.

It was also found that use of one electrodeposition solution in four electrodeposition operations resulted in films having the same composition as shown in FIG. 13. Consequently, the solution can be used repeatedly.

While the invention has been described in detail and with reference to specific embodiments thereof, it will be apparent to one skilled in the art that various changes and modifications can be made therein without departing from the spirit and scope thereof.

What is claimed is:

1. A process for producing a quaternary copper-indium-sulfur-selenium thin which comprises subjecting an electro-conductive substrate to an electrodeposition in an aqueous solution containing copper sulfate, indium sulfate, selenium dioxide, and thiourea to deposit the thin film on the substrate.

2. The process as claimed in claim 1, wherein the elements constituting said thin film have an atomic ratio controlled by regulating deposition potential in said electrodeposition and concentration of said electrodeposition solution.

3. A process for producing a quaternary copper-indium-sulfur-selenium thin film which comprises adding thiourea to an aqueous solution acidified with sulfuric acid in which copper sulfate, indium sulfate, and selenium dioxide are dissolved, removing any resulting precipitate from the aqueous solution to obtain an electrodeposition solution, and subjecting an electro-conductive substrate to an electrodeposition using the obtained electrodeposition solution to deposit the thin film on the substrate.

4. The process as claimed in claim 3, wherein the elements constituting said thin film have an atomic ratio controlled by regulating deposition potential in said electrodeposition and concentration of said electrodeposition solution.

5. A process for producing a copper-indium-sulfur-selenium chalcopyrite crystal which comprises subjecting an electro-conductive substrate to an electrodeposition in an aqueous solution containing copper sulfate, indium sulfate, selenium dioxide, and thiourea to deposit the crystal on the substrate, and then heating the substrate.

6. The process as claimed in claim 5, wherein the elements constituting said chalcopyrite crystal have an atomic ratio controlled by regulating deposition potential in said electrodeposition and concentration of said electrodeposition solution.

7. A process for producing a copper-indium-sulfur-selenium chalcopyrite crystal which comprises adding thiourea to an aqueous solution acidified with sulfuric acid in which copper sulfate, indium sulfate, and selenium dioxide are dissolved, removing any resulting precipitate from the aqueous solution to obtain an electrodeposition solution, subjecting an electro-conductive substrate to an electrodeposition using the obtained electrodeposition solution to deposit the crystal on the substrate and then heating the substrate.

8. The process as claimed in claim 7, wherein the elements constituting said chalcopyrite crystal have an atomic ratio controlled by regulating deposition potential in said electrodeposition and concentration of said electrodeposition solution.

* * * * *